United States Patent [19]

Kim et al.

[11] Patent Number: 5,471,156
[45] Date of Patent: Nov. 28, 1995

[54] DEVICE AND METHOD FOR BINARY-MULTILEVEL OPERATION

[75] Inventors: Jin U. Kim; Sun Y. Kim; Jeom D. Lee, all of Daejeon, Rep. of Korea

[73] Assignee: Electronics and Telecommunications Research Institute, Daejeon, Rep. of Korea

[21] Appl. No.: 352,057

[22] Filed: Nov. 30, 1994

[30]  Foreign Application Priority Data

Nov. 30, 1993 [KR] Rep. of Korea .................. 1993-25909
Nov. 30, 1993 [KR] Rep. of Korea .................. 1993-25910
Nov. 30, 1993 [KR] Rep. of Korea .................. 1993-25911

[51] Int. Cl.$^6$ .......................... H03K 19/00; H03K 19/02
[52] U.S. Cl. .................................................. 326/60
[58] Field of Search ..................... 326/60, 59, 35

[56]  References Cited

U.S. PATENT DOCUMENTS

| | | | |
|---|---|---|---|
| 3,628,000 | 12/1971 | Weiss ......................................... | 326/60 |
| 4,038,564 | 7/1977 | Hakata ....................................... | 326/60 |
| 4,408,135 | 10/1983 | Yuyama et al. ............................. | 326/60 |
| 4,631,428 | 12/1986 | Grimes ...................................... | 326/59 |

Primary Examiner—Edward P. Westin
Assistant Examiner—Richard Roseen
Attorney, Agent, or Firm—Spencer, Frank & Schneider

[57]  ABSTRACT

To provide a binary-multilevel OR gate, a binary-multilevel AND gate, a binary-multilevel EXCLUSIVE OR gate and their operational methods, which enable direct logic operations between multilevel logic values and binary logic values, including logic operations between binary numbers, the present invention comprises a switch for performing binary-multilevel OR gate operations, which select and output according to binary logic signal values only an input out of its both inputs of a multilevel logic signal and a maximum value of the multilevel logic signal; a switch for performing binary-multilevel AND gate operations, which select and output according to binary logic signals only an input out of its both inputs of multilevel logic signals and a minimum value of the multilevel logic signal; and a switch for performing binary-multilevel EXCLUSIVE OR gate operations, which select and output according to binary logic signals only an input out of its both inputs of a multilevel logic signal and the complementary value of the multilevel logic signal. Accordingly, the present invention has an advantage of enabling the construction of economical and simple circuits.

12 Claims, 8 Drawing Sheets

| OR | 0 | 1 |
|----|---|---|
| 0  | 0 | 1 |
| 1  | 1 | 1 |

| AND | 0 | 1 |
|-----|---|---|
| 0   | 0 | 0 |
| 1   | 0 | 1 |

| EXOR | 0 | 1 |
|---|---|---|
| 0 | 0 | 1 |
| 1 | 1 | 0 |

FIG. 10
| ⊕ | R |
|---|---|
| 0 | R |
| 1 | Max of R |
FIG. 11
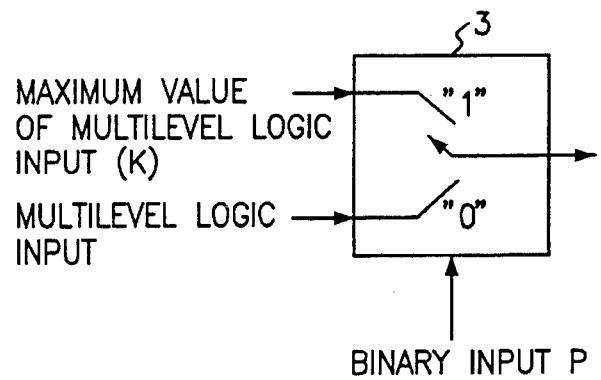
FIG. 12
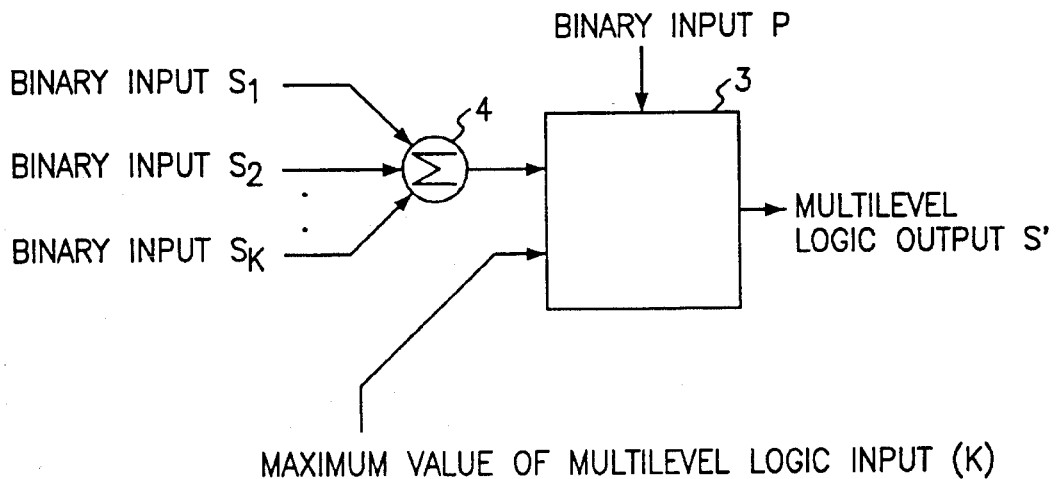

FIG. 13
| ⊙ | R |
|---|---|
| 0 | Min of R |
| 1 | R |
FIG. 14
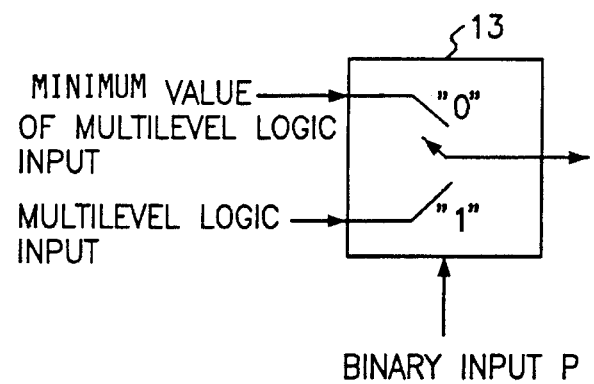
FIG. 15
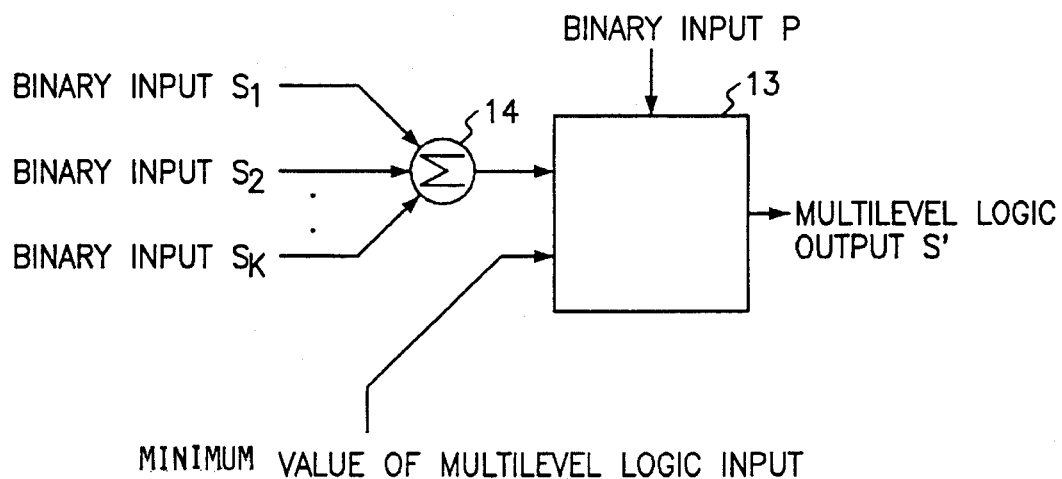

FIG. 16
FIG. 17
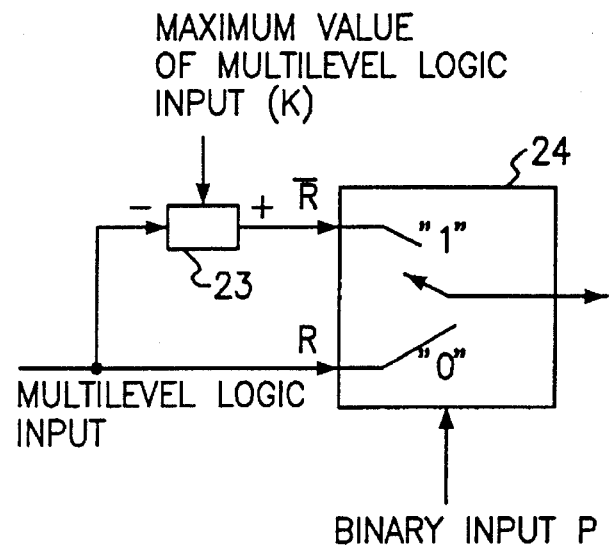
FIG. 18
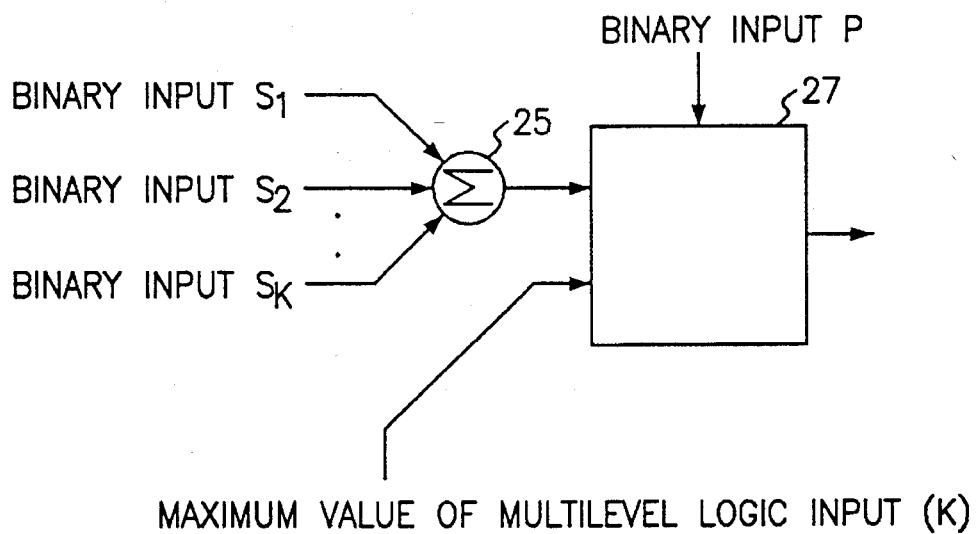

DEVICE AND METHOD FOR BINARY-MULTILEVEL OPERATION

BACKGROUND OF THE INVENTION

1. Field of the invention

The present invention relates to device and method for binary-multilevel logic operation, especially to the logic gates and their operational methods for processing multilevel logic and binary logic signals.

2. Description of the prior art

Most of modern electronic systems basically use digital signal processing, which processes electrical signals in digital forms. Digital signal processing refers to a method that processes, for a certain purpose, the digital data converted from analog signals through an A/D(Analog to Digital) converter and obtains desired results.

Generally, digital signals are represented by binary numbers and logic gates are widely used to perform logic operations between these binary numbers. Conventional logic gates are used only for the input of binary numbers.

The structure and operation of conventional gates will be described further herein below:

The truth table for a conventional binary OR gate is shown in FIG. 1. A symbol for such an OR gate is commonly expressed as an addition symbol. (+), while the present invention uses a different symbol of (=+=) indistinction from the arithmetic addition symbol (+). FIG. 2 represents a symbol for the conventional binary OR gate.

The binary OR gate truth table, shown in FIG. 1, represents relationship between the input and output of the binary OR gate shown in FIG. 2. In FIG. 2, if both inputs are at the level of logic 0, the output will be at the level of logic 0. If the inputs are logic 0 and logic 1 respectively, the output will be logic 1. And if both inputs are at the level of logic 1, the output will be at the level of logic 1.

FIG. 3 shows the truth table for a conventional binary AND gate. A symbol for such an AND gate is commonly expressed as (•) A symbol for the conventional AND gate is shown in FIG. 4.

The binary AND gate truth table, shown in FIG. 3, represents relationship between the input and output of the binary AND gate shown in FIG. 4. Namely, if both inputs are at the level of logic 0, the output will be at the level of 0. The inputs of logic 0 and logic 1 will result in the output of logic 0. The output will be logic 1 if both inputs are at the level of logic 1.

Additionally, FIG. 5 shows the truth table for a conventional binary EXCLUSIVE OR gate. A symbol for such an EXCLUSIVE OR gate is commonly expressed as ($\oplus$). A symbol for the conventional EXCLUSIVE OR gate is shown in FIG. 6.

The binary EXCLUSIVE OR gate truth table, shown in FIG. 5, represents the input and output of the binary EXCLUSIVE OR gate shown in FIG. 6. Namely, if both inputs are at the level of logic 0, the output be at the level of logic 0. The inputs of logic 0 and logic 1 will result in the output of logic 1. The output will be logic 0 if both inputs are at the level of logic 1. Here the logic 0 or logic 1 represents a logic value 0 or a logic value 1 and can be mapped into and used as an actual voltage level of 0 volt or 1 volt.

Accordingly, such binary OR, AND, and EXCLUSIVE OR gates are widely used for most of the digital signals that can be expressed in the columns of binary numbers.

In the meanwhile, a problem exists in determining how one can perform necessary operations for the case where one of either inputs, for such binary logic gates, have no binary logic values. The output of the binary logic gates explained earlier for processing binary logic values will also have binary values. But, after the operation of arithmetic addition or multiplication of the binary logic values, the binary logic values will be changed to multilevel logic values. To solve such a problematic operation for processing multilevel logic values and binary logic values, several binary logic gates can be used.

The configurations of the prior art for performing binary-multilevel logic operations using binary logic gates are shown in FIGS. 7 to 9.

The configuration of the prior art for performing an OR operation, for processing binary-multilevel signals, is shown in FIG. 7, the configuration of the prior art for performing an AND operation, for processing binary-multilevel signals, is shown in FIG. 8, and the configuration of the prior art for performing an EXCLUSIVE OR operation, for processing binary-multilevel signals, is also shown in FIG. 9.

As shown in FIG. 7, a conventional gate for processing binary-multilevel OR operations can not directly process multilevel logic values since it uses the binary logic OR gate. Therefore, binary-multilevel logic OR operations are performed by a circuit configuration, consisting of a plurality (K) of binary OR gates 1, where binary logic values are inputted from one common input point and plural binary logic values are inputted as a plurality (K) of binary logic values respectively from other individual input signals, and also of an arithmetic adder 2, where the outputs of a plurality (K) of said binary logic OR gates 1 are inputted to and performs their arithmetic additions.

Here, said arithmetic adder 2, which of course is designed to make multilevel logic signals, is realized as a full adder. In some cases an arithmetic multiplicator is used instead of said arithmetic adder.

As shown in FIG. 8, a conventional gate for processing binary-multilevel AND operations can not directly process multilevel logic values since it uses binary logic AND gates. Therefore, binary-multilevel logic AND operations are performed by a circuit configuration consisting of a plurality (K) of the binary AND gates 11, where binary logic values are inputted from one common input point and plural binary logic values are inputted as a plurality (K) of binary logic values respectively from other individual input signals, and an arithmetic adder 12, where the outputs of a plurality (K) of said binary logic OR gates 11 are inputted to and performs arithmetic multiplication.

Here, said arithmetic adder 12, which of course is designed to make multilevel logic signals, is realized as a full adder. In some cases an arithmetic multiplicator is used instead of said arithmetic adder.

As shown in FIG. 9, a conventional gate for processing binary-multilevel EXCLUSIVE OR operations can not directly process multilevel logic values since it uses binary logic EXCLUSIVE OR gates. Therefore, binary-multilevel logic EXCLUSIVE OR operations are performed by a circuit configuration, consisting of a plurality (K) of the binary EXCLUSIVE OR gates 21, where binary logic values are inputted from one common input point and plural binary logic values are inputted as a plurality (K) of binary logic values respectively from other individual input signals, and an arithmetic adder, where the outputs of a plurality (K) of said binary logic EXCLUSIVE OR gates 21 are inputted to and performs arithmetic multiplication.

Here, said arithmetic adder, which of course is designed to make multilevel value signals, is realized as a full adder. In some cases an arithmetic multiplicator can be used instead of said arithmetic adder.

However, since the same numbers of binary logic gates as the multilevel numbers are needed to perform binary-multilevel logic operations by utilizing the conventional binary logic gates aforementioned, there exists a problem that a circuit configuration, for electronic systems, can be too complicated to apply conventional method to the electronic systems.

SUMMARY OF THE INVENTION

The first object of the present invention is to provide a binary-multilevel OR gate and its operational method, which enable the direct OR operation between multilevel logic values and binary logic values, including the conventional OR operational function between binary numbers.

The second object of the present invention is to provide a binary-multilevel AND gate and its operational method, which enable the direct AND operation between multilevel logic values and binary logic values, including the conventional AND operational function between binary numbers.

The third object of the present invention is to provide a binary-multilevel EXCLUSIVE OR gate and its operational method, which enable the direct EXCLUSIVE OR operation between multilevel logic values and binary logic values, including the conventional EXCLUSIVE OR operational function between binary numbers.

To achieve the first object of the present invention, a binary-multilevel OR gate comprises a multilevel logic signal input line for transferring a multilevel logic signal(R), to be supplied from multilevel logic signal sources, as an object of the operation; a multilevel logic signal maximum value input line which transfers a maximum value signal (Max. of R) of the multilevel logic signals in a fixed manner; and selection means for selecting and outputting either the multilevel logic signal or the maximum value signal of the multilevel logic signals, when a multilevel logic signal from said multilevel logic signal input line and a maximum value signal from said multilevel logic signal maximum value input line are inputted respectively, as input signals, and a binary logic signal is inputted, as a control signal.

Also, to achieve the first object of the present invention, the binary-multilevel OR gate operational method comprises a first step of receiving inputs of a binary logic signal and a multilevel logic signal, as object values for logic operations, and also an input of a maximum value of the multilevel logic signal; and a second step of selecting and outputting, as an output value of the operation, the multilevel logic signal if the binary logic signal is 0 and a maximum value of the multilevel logic signal if the binary logic signal is 1.

To achieve the second object of the present invention, a binary-multilevel AND gate comprises a multilevel logic signal input line for transferring a multilevel logic signal(R), to be supplied from multilevel logic signal sources, as an object of the operation; a multilevel logic signal minimum value input line which transfers a minimum value signal (Min. of R) of the multilevel logic signal in a fixed manner; and selection means for selecting and outputting either the multilevel logic signal or the minimum value signal of the multilevel logic signals, when a multilevel logic signal from said multilevel logic signal input line and a minimum value signal from said multilevel logic signal minimum value input line are inputted respectively, as input signals, and a binary logic signal is inputted, as a control signal.

Also, to achieve the second object of the present invention, the binary-multilevel AND gate operational method comprises a first step of receiving inputs of a binary logic signal and a multilevel logic signal, as object values for logic operations, and also an input of a minimum value of the multilevel logic signal; and a second step of selecting and outputting, as an output value of the operation, a minimum value of the multilevel logic signal if the binary logic signal is 0 and the multilevel logic signal if the binary logic signal is 1.

To achieve the third object of the present invention, a binary-multilevel EXCLUSIVE OR gate comprises a multilevel logic signal input line for transferring a multilevel logic signal(R), to be supplied from multilevel logic signal sources, as an object of the operation; a multilevel logic signal maximum value input line which transfers a maximum value signal of said multilevel logic signal (Max. of R) in a fixed manner; a subtractor, which outputs the complement signal ($\overline{R}$) of said multilevel logic signal after the subtraction of the inputted multilevel logic value from the maximum value of the multilevel logic signal, when a multilevel logic signal from said multilevel logic signal input line and a maximum value signal from said multilevel logic signal maximum value input line are inputted respectively as input signals; and selection means for receiving the input of the complement signal of the multilevel logic signal, which is the output signal of said substractor, and also receiving the input of a binary logic signal, as a control signal.

Also, to achieve the third object of the present invention, a binary-multilevel EXCLUSIVE OR gate operational method comprises a first step of receiving inputs of a binary logic signal and a multilevel logic signal, as object values for logic operations, and also an input of a maximum value of the multilevel logic signal; a second step of obtaining a complement value of the multilevel logic signal value by subtracting the inputted multilevel logic signal value from the maximum value of said multilevel logic signal; and a third step of selecting and outputting, as an output value of the operation, a multilevel logic signal if the binary logic signal is 0 and the complement value of the multilevel logic signal if the binary logic signal is 1.

BRIEF DESCRIPTION OF THE DRAWINGS

The above and other objects, features and advantages of the present invention will be more clearly understood from the following detailed description taken in conjunct ion with the accompanying drawings, in which:

FIG. 10 is a truth table according to the binary-multilevel OR gate operation of the present invention;

FIG. 11 is a configuration of a binary-multilevel OR gate of the present invention;

FIG. 12 is a block diagram for the configuration of the binary-multilevel OR gate of the present invention;

FIG. 13 is the truth table according to the binary-multilevel AND gate operation of the present invention;

FIG. 14 is a configuration of the binary-multilevel AND gate of the present invention;

FIG. 15 is a block diagram for the configuration of the binary-multilevel AND gate of e present invention;

FIG. 16 is the truth table according to the binary-multilevel EXCLUSIVE OR gate operation of the present invention;

FIG. 17 is a configuration of the binary-multilevel EXCLUSIVE OR gate of the present invention; and FIG. 18 is a block diagram for the configuration of the binary-multilevel EXCLUSIVE OR gate of the present invention.

DETAILED DESCRIPTION OF THE PREFERRED EMBODIMENTS

An embodiment of the present invention will be described in detail hereinafter.

FIG. 10 is the truth table for the OR gate operation with the inputs of binary logic values and multilevel logic values according to the present invention and FIG. 11 shows a binary-multilevel OR gate for performing necessary operations according to the truth table shown in FIG. 10.

A binary-multilevel OR operation, according to the truth table shown in FIG. 10, outputs a multilevel logic signal if the binary logic signal is 0, and the maximum value signal selected out of multilevel logic signals if the binary logic signal is 1.

For example, assuming that the value of the multilevel logic input can take any number ranging from 0 to 10 and the value of the present input is 7, he output of the binary-multilevel OR operation will be 7 if the binary logic input value is 0, and 10 if the binary logic input value is 1. Such operation can be performed by the configuration of a binary-multilevel OR gate shown in FIG. 11.

As shown in FIG. 11, a binary-multilevel OR gate comprises a multilevel logic signal input line for transferring the multilevel logic signal (R), to be supplied from multilevel logic signal sources, as an object of the operation; a multilevel logic signal maximum value input line, which transfers a maximum value signal (Max. of R) of the multilevel logic signals in a fixed manner; and a switch that selects and outputs the multilevel logic signal if the binary logic control signal is 0 and the maximum value signal of the multilevel logic signals if the binary logic control signal is 0, when a multilevel logic signal from said multilevel logic signal input line and a maximum value signal from said multilevel logic signal maximum value input line are inputted respectively as input signals and a binary logic signal, which is the other object of the operation, is inputted as a control signal.

Here, said switch can be realized as electronic control switches or two-to-one multiplexers with control signals.

Figures 1, 2:
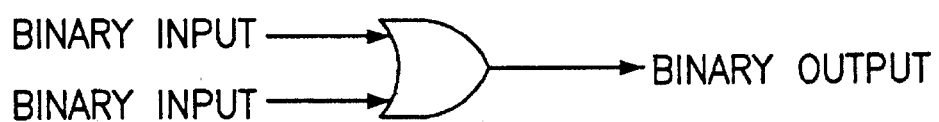
FIG. 1 is a binary OR gate truth table.
FIG. 2 is a configuration of inputs and output of a binary OR gate.

Additionally, such an OR operation of binary logic signals and multilevel logic signals includes conventional OR operation for binary logic signals. That is to say, the binary-multilevel OR operation will have the same results shown in the truth table for the binary logic operation in FIG. 1, when the multilevel logic signal value is only 0 or 1.

Figure 7:
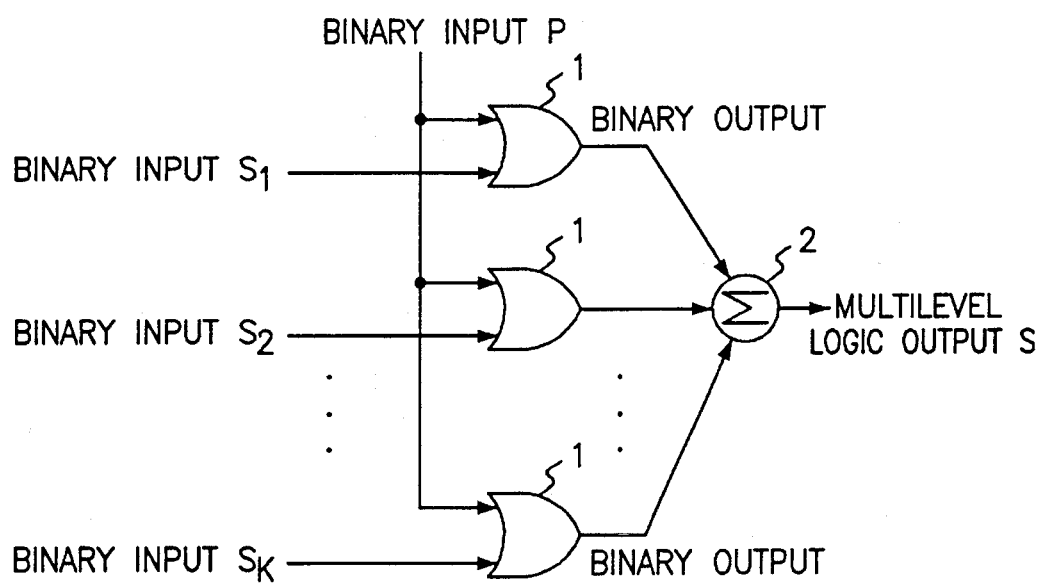
FIG. 7 is a circuit diagram of a prior art for performing an OR operation for processing binary-multilevel signals.

The use of said binary-multilevel OR gate, according to the present invention, will eliminate the configuration of the complicated circuit, as shown in FIG. 7, in performing binary-multilevel OR gate operations, which will be described in detail herein below.

At first, a logic expression for the output of the logic circuits shown in FIG. 7 will be $$S = \sum_{i=1}^{K} (S_i =+= P) \qquad \text{(Expression 1)}$$

where S is its output, $S_i$ (i=1,2, ... k) and P are binary values. An arithmetic adder and K numbers of binary OR gates, as shown in FIG. 7, will be needed for the operation of the above logic expression. When the binary-multilevel OR gate, shown in FIG. 11, is used to calculate the expression 1, the configuration, as shown in FIG. 12, will be needed. FIG. 12 is a block diagram for the binary-multilevel OR gate of the present invention, which comprises an arithmetic adder 4 for outputting multilevel logic values by the arithmetic addition of plurality (K) of the binary logic values to be inputted and switch 3, which the multilevel logic value (R) that is the output of said arithmetic adder 4 is inputted to as an input signal, a maximum value of said multilevel logic value (Max. of R) is inputted to as the other input signal, and a binary logic value is inputted to as a control signal. Here, the maximum value of the multilevel logic value is inputted as a fixed value since it has already been given at the time of the design of the circuit.

Figures 5, 6:
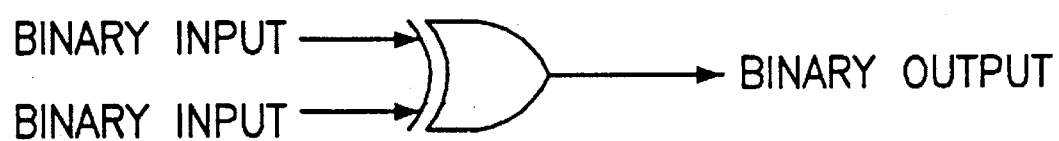
FIG. 5 is a binary EXCLUSIVE OR gate truth table.
FIG. 6 is a configuration of inputs and output of a binary EXCLUSIVE OR gate.

The output S' of FIG. 6 can be expressed as the following expression:

$$S' = \left( \sum_{i=1}^{K} S_i \right) \doteq P \qquad \text{(Expression 2)}$$

where $\doteq$ is a symbol for the binary-multilevel OR gate operation.

if the binary-multilevel OR gate according to the block diagram, shown in FIG. 12, can output the same result a obtained from the output of the conventional circuit configuration, shown in FIG. 7, it will automatically be proven that binary-multilevel OR gate operations can surely be performed by a simple configuration shown in FIG. 12.

The above fact can be proven since arithmetic addition and binary OR are linear gates and the commutative law and distributive law can be established.

To show that the above two expressions are the same, let's compare S and S' in the case where K=3, S1=(100110101), S2=(011001010), S3=(110101100), and P=(010110010). S, which is calculated according to Expression 1 will be as follows:

$$S = (100110101) =+= (010110010) + \qquad \text{(Expression 3)}$$
$$(011001010) =+= (010110010) +$$
$$(110101100) =+= (010110010)$$
$$= (110110111) + (011111010) + (110111110)$$
$$= (2313332231)$$

Also, S', which is calculated according to Expression 2, will be as follows:

$$S' = [(100110101) + (011001010) + \qquad \text{(Expression 4)}$$
$$(110101100)] \odot (010110010)$$
$$= (221212211) \odot (010110010)$$
$$= (231332231)$$

It can be observed that the above two expressions, 3 and 4, yield the same calculation result. Therefore, it can be said that the circuit configuration, shown in FIG. 12, using the present invention, performs the same operation as the conventional circuit configuration shown in FIG. 7.

The configuration in FIG. 12 shows an example of the circuit consisting of conventional binary OR gates and an arithmetic adder. But, the same operation can be applied to a logic circuit consisting of binary OR gates and an arithmetic multiplicator.

FIG. 13 is the truth table, according to the binary-multilevel AND gate operation of the present invention, whose inputs are binary logic values and multilevel logic values and FIG. 14 is a configuration of the binary-multilevel AND gate for performing operations according to the truth table in FIG. 13.

A binary-multilevel AND operation, according to the truth table shown in FIG. 13, outputs the minimum value signal selected out of multilevel logic signals if the binary logic signal is 0 and a multilevel logic signal if the binary logic signal is 1.

For example, assuming that the value of the multilevel logic input can take any number ranging from 0 to 10 and the value of the present input is 7, the output of the binary-multilevel AND operation will be 0 if the binary logic input value is 0, and 7 if the binary logic input value is 1. Such operation can be performed by the configuration of a binary-multilevel AND gate shown in FIG. 14.

As shown in FIG. 14, a binary-multilevel AND gate comprises a multilevel logic signal input line for transferring the multilevel logic signal (R) to be supplied from multilevel logic signal sources as an object of the operation; a multilevel logic signal minimum value input line, which transfers a minimum value signal (Min. of R) of the multilevel logic signals in a fixed manner; and a switch that selects and outputs the minimum value signal of the multilevel logic signals if the binary logic control signal is 0 and the multilevel logic signal if the binary logic control signal is 1, when a multilevel logic signal from said multilevel logic signal input line and a minimum value signal from said multilevel logic signal minimum value input line are inputted respectively as input signals and a binary logic signal, which is the other object of the operation, is inputted as a control signal.

Here, said switch can be realized as electronic control switches or two-to-one multiplexers with control signals.

Figures 3, 4:
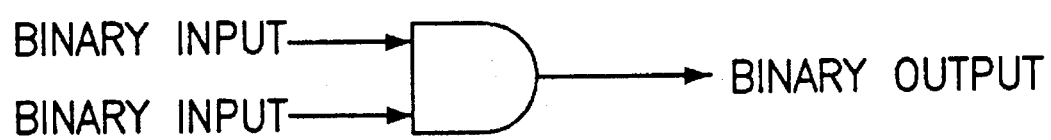
FIG. 3 is a binary AND gate truth table.
FIG. 4 is a configuration of inputs and output of a binary AND gate.

Additionally, such an AND operation of binary logic signals and multilevel logic signals includes conventional AND operation for binary logic signals. That is to say, the binary-multilevel AND operation will have the same results shown in the truth table for the binary logic operation in FIG. 3, when the multilevel logic signal value has only 0 or 1.

Figure 8:
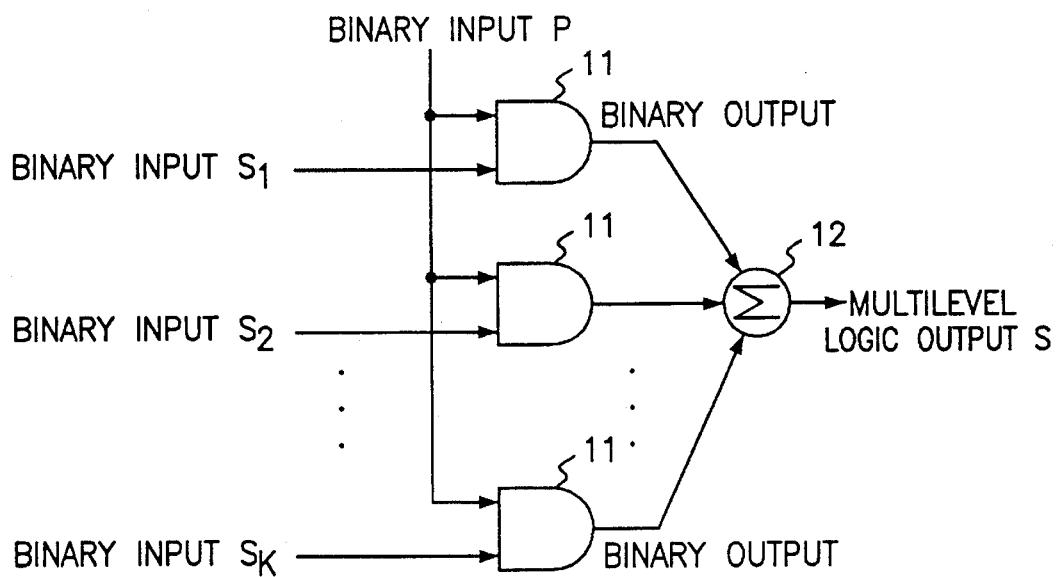
FIG. 8 is a circuit diagram of a prior art for performing an AND operation for processing binary-multilevel signals.

The use of said binary-multilevel AND gate, according to the present invention, will eliminate the configuration of the complicated circuit, as shown in FIG. 8, in performing binary-multilevel AND gate operations, which will be described in detail herein below.

A logic expression for the output of the logic circuits shown in FIG. 7. will be $$S = \sum_{i=1}^{K} (S_i \bullet P) \qquad \text{(Expression 5)}$$

where S is its output, $S_i(i=1,2,\ldots k)$ and P are binary values. An arithmetic adder and K numbers of binary AND gates, as shown in FIG. 8, will be needed for the operation of the above logic expression. When the binary-multilevel AND gate, shown in FIG. 14, is used to calculate the expression 5, the configuration, as shown in FIG. 15, will be needed. FIG. 15 is a block diagram for the binary-multilevel AND gate of the present invention, which comprises an arithmetic adder 14 for outputting multilevel logic values by the arithmetic addition of a plurality (K) of the binary logic values, to be inputted, and a switch 13, which the multilevel logic value (R) that is the output of sad arithmetic adder 14 is inputted to as an input signal, a minimum value of said multilevel logic value (Min. of R) is inputted to as the other input signal and a binary logic value is inputted to as a control signal. Here, the minimum value of the multilevel logic value is inputted as a fixed value since it has already been given at the time of the design of the circuit.

The output S' of FIG. 15 can be expressed as the following expression:

$$S' = \left( \sum_{i=1}^{K} S_i \right) \odot P \qquad \text{(Expression 6)}$$

where $\odot$ a symbol for the binary-multilevel AND gate operation.

If the binary-multilevel AND gate; according to the block diagram shown in FIG. 15, can output the same result as obtained from the output of the conventional circuit configuration shown in FIG. 8, it will automatically be proven that binary-multilevel AND gate operations can surely be performed by the simple configuration shown in FIG. 15.

The above fact can be proven since arithmetic addition and binary AND are linear operators and the commutative law and distributive law can be established.

To show that the above two expressions are the same, let's compare S and S' in the case where K=3, S1=(100110101), S2=(011001010), S3=(110101100); and P=(010110010). S, which is calculated according to Expression 5 will be as follows:

$$S = (100110101) \bullet (010110010) + \qquad \text{(Expression 7)}$$
$$(011001010) \bullet (010110010) +$$
$$(110101100) \bullet (010110010)$$
$$= (000110010) + (010000010) + (0100100000)$$
$$= (020210010)$$

Also, S', which is calculated according to Expression 6, will be as follows:

$$S' = [(100110101) + (011001010) + \qquad \text{(Expression 8)}$$
$$(110101100)] \odot (010110010)$$
$$= (221212211) \odot (010110010)$$
$$= (020210010)$$

It can be observed that the above two expressions, 7 and 8, yield the same calculation result. Therefore, it can be said that the circuit configuration, shown in FIG. 15, using the present invention, performs the same operation as the conventional circuit configuration shown in FIG. 7.

The configuration in FIG. 15 shows an example of the circuit consisting of conventional binary AND gates and an arithmetic adder. But, the same operation can be applied to a logic circuit consisting of binary AND gates and an arithmetic multiplicator.

FIG. 16 is the truth table, according to the binary-multilevel EXCLUSIVE OR gate operation, of the present invention, whose inputs are binary logic values and multilevel logic values, and FIG. 17 is a configuration of the binary-multilevel EXCLUSIVE OR gate for performing operations according to the truth table in FIG. 16.

A binary-multilevel EXCLUSIVE OR operation, according to the truth table shown in FIG. 16, outputs the complement value signal selected out of multilevel logic signals if the binary logic signal is 1 and a multilevel logic signal (R) if the binary logic signal is 0. Here, the complement of the multilevel logic value means the value obtained by the subtraction of a multilevel logic value from the maximum value that the multilevel logic value can take, and it is represented by ($\overline{R}$).

For example, assuming that the value of the multilevel logic input can take any number ranging from 0 to 10 and the value of the present input is 7, the output of the binary-multilevel EXCLUSIVE OR operation will be 7 if the binary logic input value is 0, and will be 10−7=3 if the binary logic input value is 1. Such operations can be performed by the configuration of a binary-multilevel AND gate shown in FIG. 17.

As shown in FIG. 17, a binary-multilevel EXCLUSIVE OR gate comprises a multilevel logic signal input line for transferring the multilevel logic signal (R), to be supplied, from multilevel logic signal sources as an object of the operation; a multilevel logic signal maximum value input line which transfers a maximum value signal (Max. of R) of the multilevel logic signals in a fixed manner; a subtractor 23, which outputs the complement signal of said multilevel logic signal after the subtraction of the inputted multilevel logic value from the maximum value of the multilevel logic signal, when a multilevel logic signal from said multilevel logic signal input line and a maximum value signal from said multilevel logic signal maximum value input line are inputted respectively as input signals; and a switch 24 that receives the input of the complement signal of the multilevel logic signal, which is the output signal of said substractor 23 and also receives the input of a binary logic signal, which is the other object of the operation, as a control signal, and selects and outputs the multilevel logic signal if the binary logic control signal is 0 and the complement signal of the multilevel logic signal, which is the output of said subtractor 23, if the binary logic control signal is 1.

Here, said switch can be realized as electronic control switches or two-to-one multiplexers with control signals.

Additionally, such an EXCLUSIVE OR operation of binary logic signals and multilevel logic signals includes conventional EXCLUSIVE OR operation for binary logic signals. That is to say, the binary-multilevel EXCLUSIVE OR operation will have the same results shown in the truth table for the binary logic operation in FIG. 5, when the multilevel logic signal value has only 0 or 1.

Figure 9:
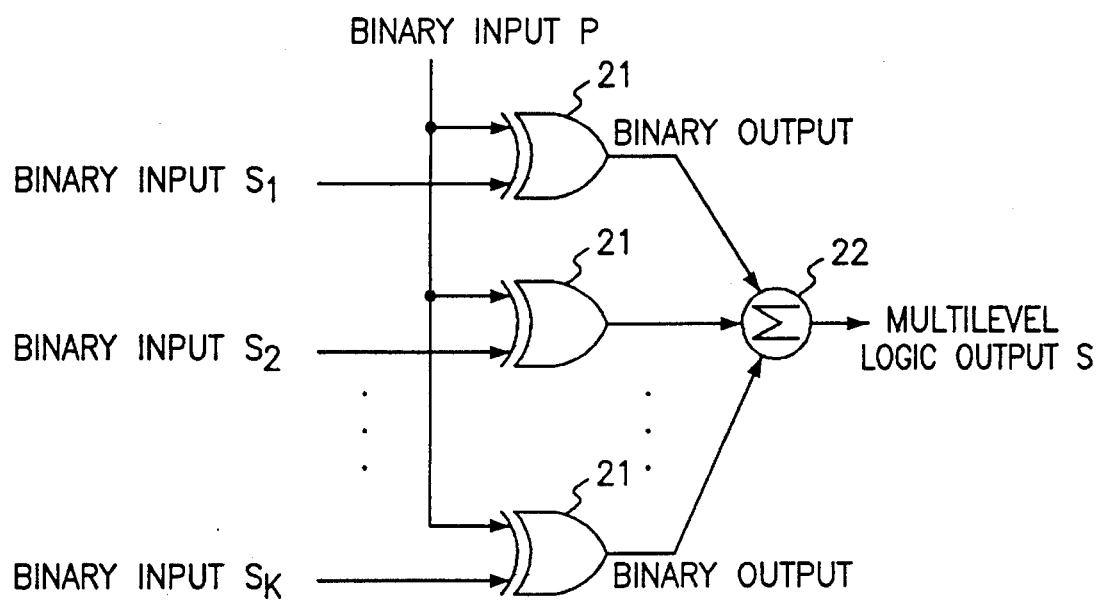
FIG. 9 is a circuit diagram of a prior art for performing an EXCLUSIVE OR operation for processing binary-multilevel signals.

The use of said binary-multilevel EXCLUSIVE OR gates, according to the present invention, will eliminate the configuration of the complicated circuit, as shown in FIG. 9, in performing binary-multilevel EXCLUSIVE OR gate operations, which will be described in detail herein below:

At first, a logic expression for the output of the logic circuits shown in FIG. 9 will be $$S = \sum_{i=1}^{K} (S_i \oplus P) \quad \text{(Expression 9)}$$

where S is its output, $S_i$(i=1,2, . . . k) and P are binary values. An arithmetic adder 22 and K numbers of binary EXCLUSIVE OR 21 gates, as shown in FIG. 9, will be needed for the operation of the above logic expression. When the binary-multilevel EXCLUSIVE OR gate, shown in FIG. 17, is used to calculate the expression 9, the configuration, as shown in FIG. 18, will be needed. FIG. 18 is a block diagram for the binary-multilevel EXCLUSIVE OR gate of the present invention, which comprises an arithmetic adder 25 for outputting multilevel logic values by the arithmetic addition of a plurality (K) of the binary logic values to be inputted and a binary-multilevel EXCLUSIVE OR gate 26, which the multilevel logic value (R) that is the output of said arithmetic adder 25 is inputted to as an input signal, a maximum value of said multilevel logic value (Max. of R) is inputted to as the other input signal, and a binary logic value is inputted to as a control signal. Here, the maximum value of the multilevel logic value is inputted as a fixed value since it has already been given at the time of the design of the circuit and the internal configuration of said binary-multilevel EXCLUSIVE OR gate 26 as shown in FIG. 17.

The output S' of FIG. 18 can be expressed as the following expression:

$$S' = \left( \sum_{i=1}^{K} S_i \right) \boxplus P \quad \text{(Expression 10)}$$

where $\boxplus$ is a symbol for the binary-multilevel EXCLUSIVE OR gate operation.

If the binary-multilevel EXCLUSIVE OR gate, according to the block diagram shown in FIG. 18, can output the same result as obtained from the output of the conventional circuit configuration, shown in FIG. 9, it will automatically be proven that binary-multilevel EXCLUSIVE OR gate operations can surely be performed by a simple configuration shown in FIG. 18.

The above fact can be proven since arithmetic addition and binary EXCLUSIVE OR are linear operators and the commutative law and distributive law can be established.

To show that the above two expressions are the same, let's compare S and S' in the case where K=3, S1=(100110101), S2=(011001010), S3=(110101100), and P=(010110010). S, which is calculated according to Expression 9 will be as follows:

$$S = (100110101) \oplus (010110010) + \quad \text{(Expression 11)}$$
$$(011001010) \oplus (010110010) +$$
$$(110101100) \oplus (010110010)$$
$$= (100011110) + (001111000) + (11000111)$$
$$= (211122221)$$

Also, S', which is calculated according to Expression 10, will be as follows:

$$S' = [(100110101) + (011001010) + \quad \text{(Expression 12)}$$
$$(110101100)] \boxplus (010110010)$$

-continued

= (221212211) ⊞(010110010)

= (211122221)

it can be observed that the above two expressions, 11 and 12, yield the same calculation result. Therefore, it can be said that the circuit configuration, shown in FIG. 18, using the present invention, performs the same operation as the conventional circuit configuration shown in FIG. 9.

The configuration in FIG. 18 shows an example of the circuit consisting of conventional binary EXCLUSIVE OR gates and an arithmetic adder. But, the same operation can be applied to a logic circuit consisting of binary EXCLUSIVE OR gates and an arithmetic multiplicator.

Accordingly, the present invention mentioned above, when compared to the prior art, has an advantage of enabling the construction of simple and economical circuits by saving a lot of binary logic gates in implementing the function of performing binary-multilevel logic operations.

Although the preferred embodiments of the present invention have been disclosed for illustrative purpose, those skilled in the art will appreciate that various modifications, additions and substitutions are possible, without departing from the scope and spirit of the invention as disclosed in the accompanying claims.

What is claimed is:

1. A binary-multilevel OR gate, comprising:

a multilevel logic signal input line for transferring a multilevel logic signal (R), to be supplied from multilevel logic signal sources, as an object of the operation;

a multilevel logic signal maximum value input line which transfers a maximum value signal (Max. of R) of the multilevel logic signals in a fixed manner; and selection means for selecting and outputting either the multilevel logic signal or the maximum value signal of the multilevel logic signals, when a multilevel logic signal from said multilevel logic signal input line and a maximum value signal from said multilevel logic signal maximum value input line are inputted respectively, as input signals, and a binary logic signal is inputted, as a control signal and is another object of the operation.

2. A binary-multi level OR gate according to claim 1, wherein said selection means comprises an electronic control switch with a control input terminal.

3. A binary-multilevel OR gate according to claim 1, wherein said selection means comprises a two-to-one multiplexer.

4. A binary-multilevel OR operational method, including:

a first step of receiving inputs of a binary logic signal and a multilevel logic signal, as object values for logic operations, and also an input of a maximum value of the multilevel logic signal; and a second step of selecting and outputting, as an output value of the operation, the multilevel logic signal if the binary logic signal is 0 and a maximum value of the multilevel logic signal if the binary logic signal is 1.

5. A binary-multilevel AND gate, comprising:

a multilevel logic signal input line for transferring a multilevel logic signal (R), to be supplied from multilevel logic signal sources, as an object of the operation;

a multilevel logic signal minimum value input line which transfers a minimum value signal (Min. of R) of the multilevel logic signal in a fixed manner; and selection means for selecting and outputting either the multilevel logic signal or the minimum value signal of the multilevel logic signals, when a multilevel logic signal from said multilevel logic signal input line and a minimum value signal from said multilevel logic signal minimum value input line are inputted respectively, as input signals, and a binary logic signal is inputted, as a control signal and is another object of the operation.

6. A binary-multilevel AND gate according to claim 5, wherein said selection means comprises an electronic control switch with a control input terminal.

7. A binary-multilevel AND gate according to claim 6, wherein said selection means comprises a two-to-one multiplexer.

8. A binary-multilevel AND operational method, including:

a first step of receiving inputs of a binary logic signal and a multilevel logic signal, as object values for logic operations, and also an input of a minimum value of the multilevel logic signal; and a second step of selecting and outputting, as an output value of the operation, a minimum value of the multilevel logic signal if the binary logic signal is 0 and the multilevel logic signal if the binary logic signal is 1.

9. A binary-multilevel EXCLUSIVE OR gate, comprising:

a multilevel logic signal input line for transferring a multilevel logic signal (R), to be supplied from multilevel logic signal sources, as an object of the operation;

a multilevel logic signal maximum value input line which transfers a maximum value signal of said multilevel logic signal (Max. of R) in a fixed manner;

a subtractor, which outputs the complement signal ($\bar{R}$) of said multilevel logic signal after the subtraction of the inputted multilevel logic value from the maximum value of the multilevel logic signal, when a multilevel logic signal from said multilevel logic signal input line and a maximum value signal from said multilevel logic signal maximum value input line are inputted respectively as input signals; and selection means for receiving the input of the complement signal of the multilevel logic signal, which is the output signal of said substractor, and also receiving the input of a binary logic signal, as a control signal and is another object of the operation.

10. A binary-multilevel EXCLUSIVE OR gate according to claim 9, wherein said selection means comprises an electronic control switch with a control input terminal.

11. A binary-multilevel EXCLUSIVE OR gate according to claim 9, wherein said selection means comprises a two-to-one multiplexer.

12. A binary-multilevel EXCLUSIVE OR operational method, comprising:

a first step of receiving inputs of a binary logic signal and a multilevel logic signal, as object values for logic operations, and also an input of a maximum value of the multilevel logic signal;

a second step of obtaining a complement value of the multilevel logic signal value by subtracting the inputted multilevel logic signal value from the maximum value of said multilevel logic signal; and a third step of selecting and outputting, as an output value of the operation, a multilevel logic signal if the binary logic signal is 0 and the complement value of the multilevel logic signal if the binary logic signal is 1.

* * * * *